(12) United States Patent
Amano et al.

(10) Patent No.: US 10,394,676 B2
(45) Date of Patent: Aug. 27, 2019

(54) GENERATION DEVICE, GENERATION METHOD, AND PROGRAM

(71) Applicant: International Business Machines Corporation, Armonk, NY (US)

(72) Inventors: Shunichi Amano, Yamato (JP); Hisashi Miyashita, Tokyo (JP); Hideki Tai, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 15/415,331

(22) Filed: Jan. 25, 2017

(65) Prior Publication Data

US 2017/0132103 A1 May 11, 2017

Related U.S. Application Data

(63) Continuation of application No. 14/627,409, filed on Feb. 20, 2015, now abandoned.

(30) Foreign Application Priority Data

Feb. 20, 2014 (JP) .................................. 2014-030275

(51) Int. Cl.
*G06F 11/263* (2006.01)
*G01R 31/3183* (2006.01)
*G06F 11/273* (2006.01)

(52) U.S. Cl.
CPC ...... *G06F 11/263* (2013.01); *G01R 31/31835* (2013.01); *G01R 31/318371* (2013.01); *G06F 11/273* (2013.01)

(58) Field of Classification Search
CPC ...... G01R 31/31813; G01R 31/318371; G01R 31/318307; G01R 31/31921; G01R 31/31835; G06F 11/273; G06F 11/263
(Continued)

(56) References Cited

U.S. PATENT DOCUMENTS 5,050,091 A * 9/1991 Rubin ................. G06F 17/5068
716/122
5,581,491 A * 12/1996 Biwer ................ G01R 31/2834
702/118

(Continued)

FOREIGN PATENT DOCUMENTS

JP 0612285 A 1/1994
JP 2008210275 A 9/2008

(Continued)

OTHER PUBLICATIONS

Kuhn, et al., "Software Fault Interactions and Implications for Software Testing", IEEE Transactions of Software Engineering, Jun. 2004, pp. 418-421, vol. 30, No. 6.

(Continued)

*Primary Examiner* — Samir W Rizk
*Assistant Examiner* — Enam Ahmed
(74) *Attorney, Agent, or Firm* — Stosch Sabo

(57) ABSTRACT

Provided is a generation device including: a test vector generation unit for selecting, for each of parameters to be included in a test vector, one value from among possible values for the parameter to generate test vectors whose combinations of values are different from each other; an extraction unit for extracting, as partial sequences each including one or more test vectors, portions of a series including the test vectors output by the test vector generation unit; and a test sequence generation unit for generating a test sequence based on the extracted partial sequences.

8 Claims, 16 Drawing Sheets

(58) Field of Classification Search
USPC .................................................. 714/738, 758
See application file for complete search history.

(56) References Cited

U.S. PATENT DOCUMENTS

| | | | | |
|---|---|---|---|---|
| 5,598,344 | A * | 1/1997 | Dangelo | G01R 31/31704 714/E11.167 |
| 6,292,765 | B1 * | 9/2001 | Ho | G01R 31/31830 703/14 |
| 8,190,953 | B2 * | 5/2012 | Chakravarthy | G01R 31/318371 714/726 |
| 8,438,442 | B2 * | 5/2013 | Morrison | G06F 11/2236 702/117 |
| 8,661,305 | B2 * | 2/2014 | Rajarao | G01R 31/318342 714/738 |
| 2002/0073374 | A1 * | 6/2002 | Danialy | G01R 31/31724 714/738 |
| 2003/0115033 | A1 | 6/2003 | Aitken et al. | |
| 2003/0145297 | A1 | 7/2003 | Cote et al. | |
| 2004/0010741 | A1 * | 1/2004 | Forlenza | G01R 31/318544 714/738 |
| 2007/0055665 | A1 | 3/2007 | Kitahara et al. | |
| 2007/0079204 | A1 * | 4/2007 | Ong | G01R 31/31928 714/738 |
| 2007/0259256 | A1 | 11/2007 | Le Canut et al. | |
| 2008/0072112 | A1 * | 3/2008 | Varadarajan | G01R 31/318536 714/738 |
| 2010/0109676 | A1 * | 5/2010 | Zjajo | G01R 31/31813 324/537 |
| 2014/0298120 | A1 * | 10/2014 | Tong | G11C 29/10 714/719 |
| 2015/0234007 | A1 | 8/2015 | Amano et al. | |
| 2016/0204781 | A1 * | 7/2016 | Plusquellic | H03K 19/00323 326/8 |

FOREIGN PATENT DOCUMENTS

| | | |
|---|---|---|
| JP | 2010191899 A | 9/2010 |
| JP | 2011034274 A | 2/2011 |
| JP | 2011044131 A | 3/2011 |
| JP | 2011065576 A | 3/2011 |
| JP | 2012185642 A | 9/2012 |
| JP | 2014026458 A | 2/2014 |

OTHER PUBLICATIONS

Yadavalli, et al., "MUSTC-Testing: Multi-Stage-Combinational Test Scheduling at the Register-Transfer Level", 8th International Conference on VLSI Design, Jan. 1995, pp. 110-115.

List of IBM Patents or Patent Applications Treated as Related, Jan. 24, 2017. 2 pages.

Decision to Grant a Patent, Application No. 2014-030275, May 24, 2016. Translated Sep. 16, 2016. 6 pages.

JP Office Action; Notification of Reasons for Refusal, Application No. 2014-030275, dated Mar. 1, 2016. Translated Sep. 16, 2016. 3 pages.

Amano, et al., "Generation Device, Generation Method, and Program", Japan Application No. 2014-030275, filed Feb. 20, 2014. 54 pages.

* cited by examiner

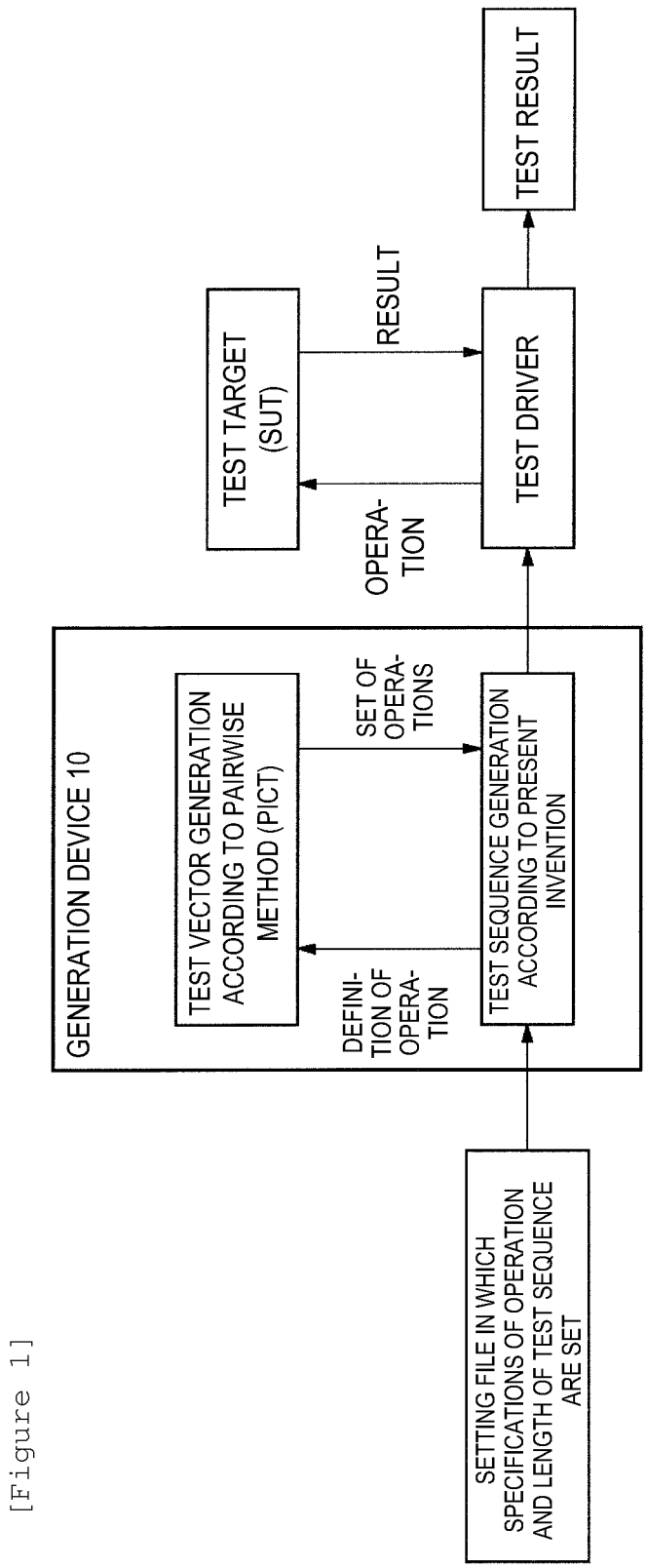
[Figure 1]

[Figure 2]
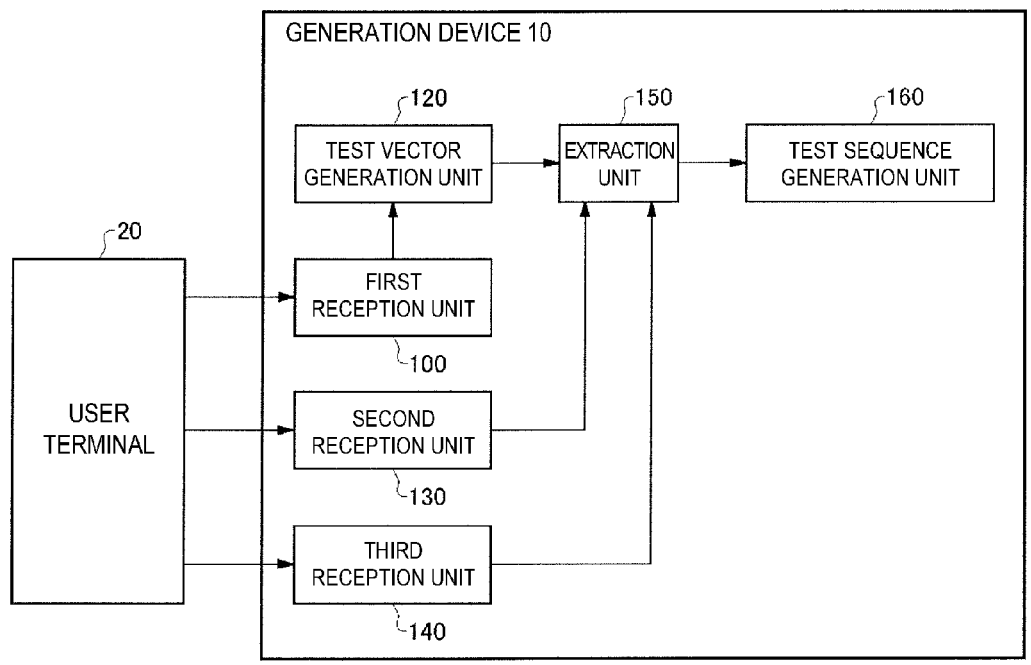

[Figure 3]
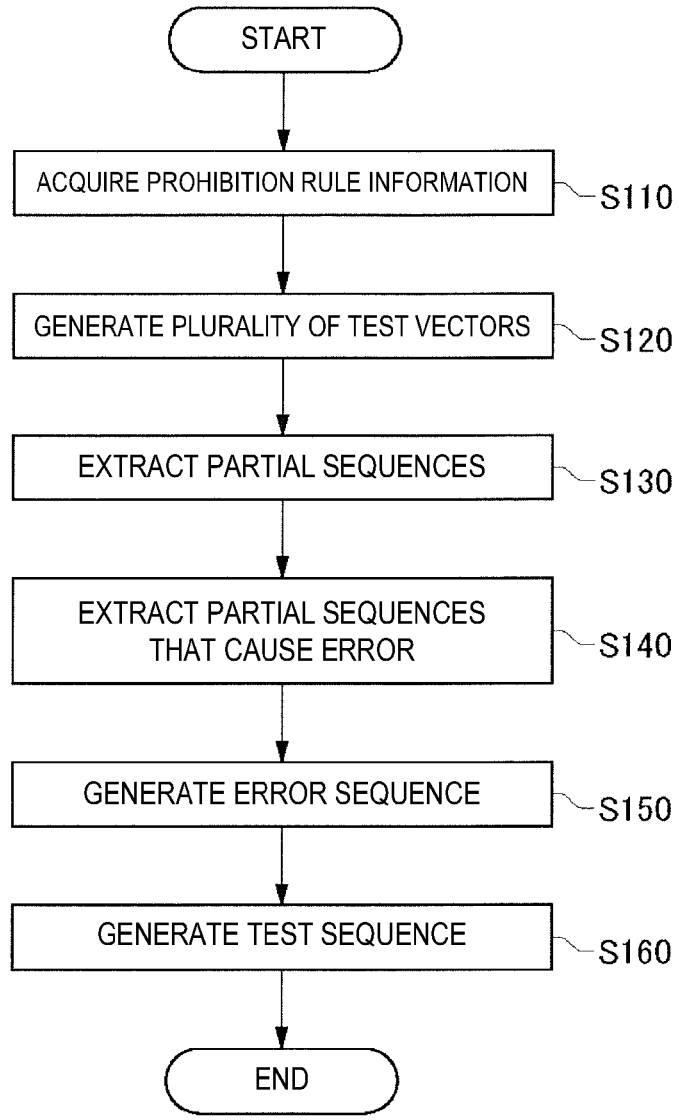
[Figure 4]
PARAMETERS OF TEST VECTORS
ID : 1 , 2 , 3
OP : INSERT , UPDATE , DELETE
Serial : 100 , 101 , 102 , NULL
Name : John , Mike , Alice , NULL

[Figure 5]

SERIES OF TEST VECTORS

| ID | OP | SE | NA |
|---|---|---|---|
| 2 | INSERT | 102 | Mike |
| 1 | UPDATE | 101 | Mike |
| 3 | INSERT | 101 | Alice |
| 3 | UPDATE | 102 | NULL |
| 1 | INSERT | 100 | NULL |
| 2 | UPDATE | 100 | Alice |
| 2 | INSERT | 101 | John |
| 3 | UPDATE | 100 | John |
| 1 | INSERT | NULL | Alice |
| 1 | UPDATE | NULL | John |
| 2 | INSERT | 101 | NULL |
| 1 | UPDATE | 102 | John |
| 3 | UPDATE | 102 | Alice |
| 2 | DELETE | NULL | NULL |
| 3 | DELETE | NULL | NULL |
| 3 | UPDATE | NULL | Mike |
| 1 | DELETE | NULL | NULL |
| 3 | INSERT | 100 | Mike |

[Figure 6]
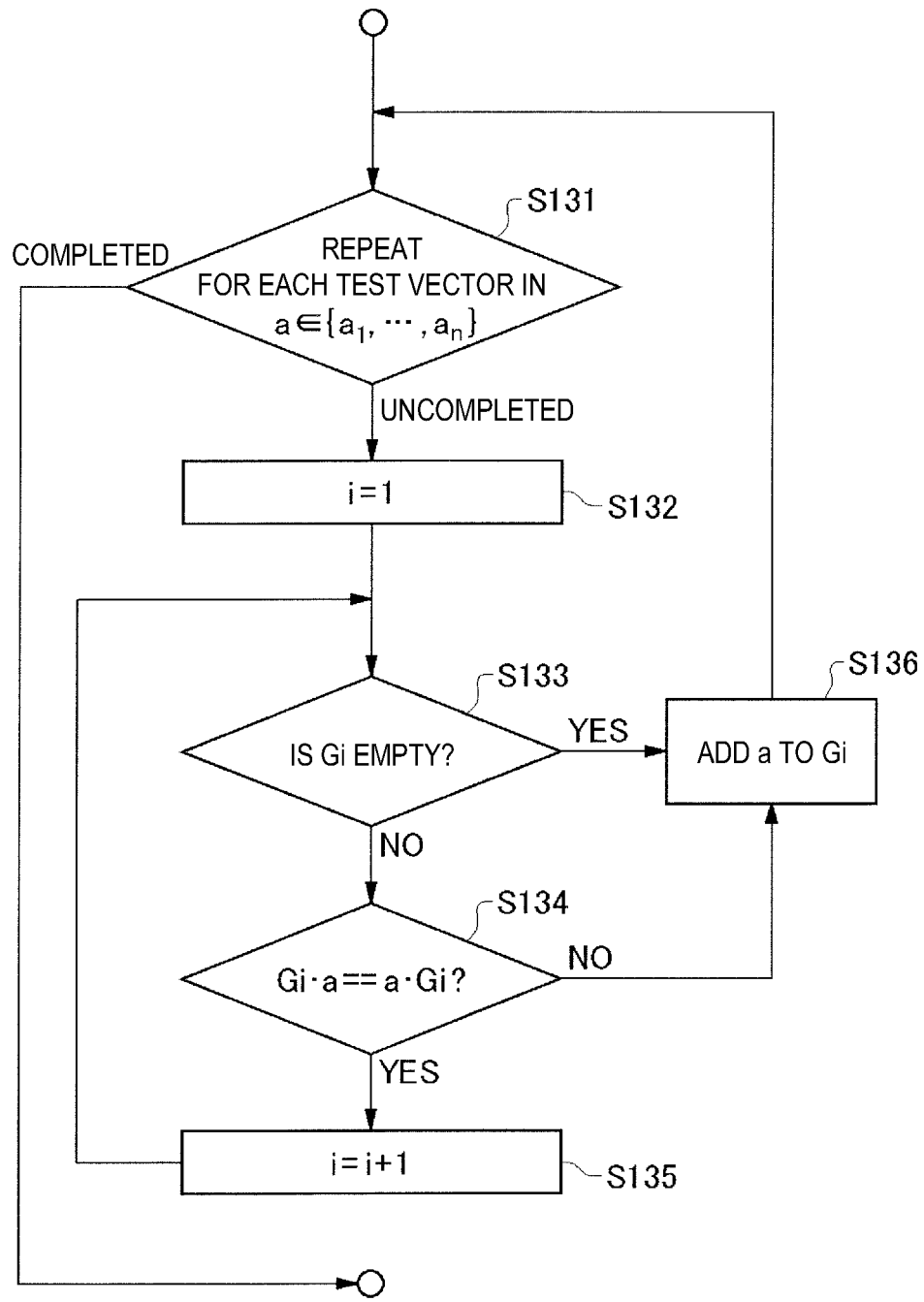

[Figure 7]

| PARTIAL SEQUENCE (G1) | | | |
|---|---|---|---|
| 1 | UPDATE | 101 | Mike |
| 1 | INSERT | 100 | NULL |
| 1 | INSERT | NULL | Alice |
| 1 | UPDATE | NULL | John |
| 1 | UPDATE | 102 | John |
| 1 | DELETE | NULL | NULL |

| PARTIAL SEQUENCE (G2) | | | |
|---|---|---|---|
| 2 | INSERT | 102 | Mike |
| 2 | UPDATE | 100 | Alice |
| 2 | INSERT | 101 | John |
| 2 | INSERT | 101 | NULL |
| 2 | DELETE | NULL | NULL |

| PARTIAL SEQUENCE (G3) | | | |
|---|---|---|---|
| 3 | INSERT | 101 | Alice |
| 3 | UPDATE | 102 | NULL |
| 3 | UPDATE | 100 | John |
| 3 | UPDATE | 102 | Alice |
| 3 | DELETE | NULL | NULL |
| 3 | UPDATE | NULL | Mike |
| 3 | INSERT | 100 | Mike |

[Figure 8]
| PARTIAL SEQUENCE (G1) | | | | |
|---|---|---|---|---|
| (1) | 1 | UPDATE | 101 | Mike |
| (2) | 1 | INSERT | 100 | NULL |
| (3) | 1 | INSERT | NULL | Alice |
| (4) | 1 | UPDATE | NULL | John |
| (5) | 1 | UPDATE | 102 | John |
| (6) | 1 | DELETE | NULL | NULL |
| PARTIAL SEQUENCE (G1-N) THAT DOES NOT CAUSE ERROR | | | | |
|---|---|---|---|---|
| (1) | 1 | UPDATE | 101 | Mike |
| (5) | 1 | UPDATE | 102 | John |
| (6) | 1 | DELETE | NULL | NULL |
| ERROR SEQUENCE (G1-1) | | | | |
|---|---|---|---|---|
| (1) | 1 | UPDATE | 101 | Mike |
| (2) | 1 | INSERT | 100 | NULL |
| ERROR SEQUENCE (G1-2) | | | | |
|---|---|---|---|---|
| (1) | 1 | UPDATE | 101 | Mike |
| (3) | 1 | INSERT | NULL | Alice |
| ERROR SEQUENCE (G1-3) | | | | |
|---|---|---|---|---|
| (1) | 1 | UPDATE | 101 | Mike |
| (4) | 1 | UPDATE | NULL | John |

[Figure 9]
```
PARTIAL SEQUENCE (G2)
(1) 2      INSERT     102      Mike
(2) 2      UPDATE     100      Alice
(3) 2      INSERT     101      John
(4) 2      INSERT     101      NULL
(5) 2      DELETE     NULL     NULL
```
```
PARTIAL SEQUENCE (G2-N) THAT DOES NOT CAUSE ERROR
(1) 2      INSERT     102      Mike
(2) 2      UPDATE     100      Alice
(5) 2      DELETE     NULL     NULL
ERROR SEQUENCE (G2-1)
(1) 2      INSERT     102      Mike
(2) 2      UPDATE     100      Alice
(3) 2      INSERT     101      John
ERROR SEQUENCE (G2-2)
(1) 2      INSERT     102      Mike
(2) 2      UPDATE     100      Alice
(4) 2      INSERT     101      NULL
```

[Figure 10]

| PARTIAL SEQUENCE (G3) | | | |
|---|---|---|---|
| (1) 3 | INSERT | 101 | Alice |
| (2) 3 | UPDATE | 102 | NULL |
| (3) 3 | UPDATE | 100 | John |
| (4) 3 | UPDATE | 102 | Alice |
| (5) 3 | DELETE | NULL | NULL |
| (6) 3 | UPDATE | NULL | Mike |
| (7) 3 | INSERT | 100 | Mike |

| PARTIAL SEQUENCE (G3-N) THAT DOES NOT CAUSE ERROR | | | |
|---|---|---|---|
| (1) 3 | INSERT | 101 | Alice |
| (3) 3 | UPDATE | 100 | John |
| (4) 3 | UPDATE | 102 | Alice |
| (5) 3 | DELETE | NULL | NULL |
| (7) 3 | INSERT | 100 | Mike |

| ERROR SEQUENCE (G3-1) | | | |
|---|---|---|---|
| (1) 3 | INSERT | 101 | Alice |
| (2) 3 | UPDATE | 102 | NULL |

| ERROR SEQUENCE (G3-2) | | | |
|---|---|---|---|
| (1) 3 | INSERT | 101 | Alice |
| (3) 3 | UPDATE | 100 | John |
| (4) 3 | UPDATE | 102 | Alice |
| (5) 3 | DELETE | NULL | NULL |
| (6) 3 | UPDATE | NULL | Mike |

[Figure 11]

(1) REPETITIONS OF EACH PARTIAL SEQUENCE

O1.O1 ...... O1,
O2.O2 ...... O2,
O3.O3 ...... O3, (2) SEQUENCE OBTAINED BY COUPLING (1)

O1.O1 ...... O1.O2.O2 ...... O2.O3.O3 ...... O3

(3) CYCLIC GROUPS OF PARTIAL SEQUENCES

O1.O2.O3,
O2.O3.O1,
O3.O1.O2, (4) SEQUENCE OBTAINED BY COUPLING (3)

| (1 | UPDATE | 101 | Mike. |
| 1 | UPDATE | 102 | John. |
| 1 | DELETE | NULL | NULL. |
| 1 | UPDATE | 101 | Mike. |
| 1 | UPDATE | 102 | John. |
| 1 | DELETE | NULL | NULL. |
| 1 | UPDATE | 101 | Mike. |
| 1 | UPDATE | 102 | John. |
| 1 | DELETE | NULL | NULL. |

⋮

| 1 | UPDATE | 101 | Mike. |
| 1 | UPDATE | 102 | John. |
| 1 | DELETE | NULL | NULL.) |

[Figure 13]

$$O2.O2 \ldots\ldots O2$$

| | | | |
|---|---|---|---|
| (2 | INSERT | 102 | Mike. |
| 2 | UPDATE | 100 | Alice. |
| 2 | DELETE | NULL | NULL. |
| 2 | INSERT | 102 | Mike. |
| 2 | UPDATE | 100 | Alice. |
| 2 | DELETE | NULL | NULL. |
| 2 | INSERT | 102 | Mike. |
| 2 | UPDATE | 100 | Alice. |
| 2 | DELETE | NULL | NULL. |

⋮

| | | | |
|---|---|---|---|
| 2 | INSERT | 102 | Mike. |
| 2 | UPDATE | 100 | Alice. |
| 2 | DELETE | NULL | NULL.) |

[Figure 14]

$$O3.O3 \ldots\ldots O3$$

| | | | |
|---|---|---|---|
| (3 | INSERT | 101 | Alice. |
| 3 | UPDATE | 100 | John. |
| 3 | UPDATE | 102 | Alice. |
| 3 | DELETE | NULL | NULL. |
| 3 | INSERT | 100 | Mike. |
| 3 | INSERT | 101 | Alice. |
| 3 | UPDATE | 100 | John. |
| 3 | UPDATE | 102 | Alice. |
| 3 | DELETE | NULL | NULL. |
| 3 | INSERT | 100 | Mike. |

⋮

| | | | |
|---|---|---|---|
| 3 | INSERT | 101 | Alice. |
| 3 | UPDATE | 100 | John. |
| 3 | UPDATE | 102 | Alice. |
| 3 | DELETE | NULL | NULL. |
| 3 | INSERT | 100 | Mike.) |

| | | | |
|---|---|---|---|
| (1 | UPDATE | 101 | Mike . |
| 1 | UPDATE | 102 | John . |
| 1 | DELETE | NULL | NULL . |
| 2 | INSERT | 102 | Mike . |
| 2 | UPDATE | 100 | Alice . |
| 2 | DELETE | NULL | NULL . |
| 3 | INSERT | 101 | Alice . |
| 3 | UPDATE | 100 | John . |
| 3 | UPDATE | 102 | Alice . |
| 3 | DELETE | NULL | NULL . |
| 3 | INSERT | 100 | Mike ) |

| | | | |
|---|---|---|---|
| (2 | INSERT | 102 | Mike . |
| 2 | UPDATE | 100 | Alice . |
| 2 | DELETE | NULL | NULL . |
| 3 | INSERT | 101 | Alice . |
| 3 | UPDATE | 100 | John . |
| 3 | UPDATE | 102 | Alice . |
| 3 | DELETE | NULL | NULL . |
| 3 | INSERT | 100 | Mike . |
| 1 | UPDATE | 101 | Mike . |
| 1 | UPDATE | 102 | John . |
| 1 | DELETE | NULL | NULL ) |

[Figure 17]
O3.O1.O2
| (3 | INSERT | 101 | Alice. |
|---|---|---|---|
| 3 | UPDATE | 100 | John. |
| 3 | UPDATE | 102 | Alice. |
| 3 | DELETE | NULL | NULL. |
| 3 | INSERT | 100 | Mike. |
| 1 | UPDATE | 101 | Mike. |
| 1 | UPDATE | 102 | John. |
| 1 | DELETE | NULL | NULL. |
| 2 | INSERT | 102 | Mike. |
| 2 | UPDATE | 100 | Alice. |
| 2 | DELETE | NULL | NULL) |
[Figure 18]
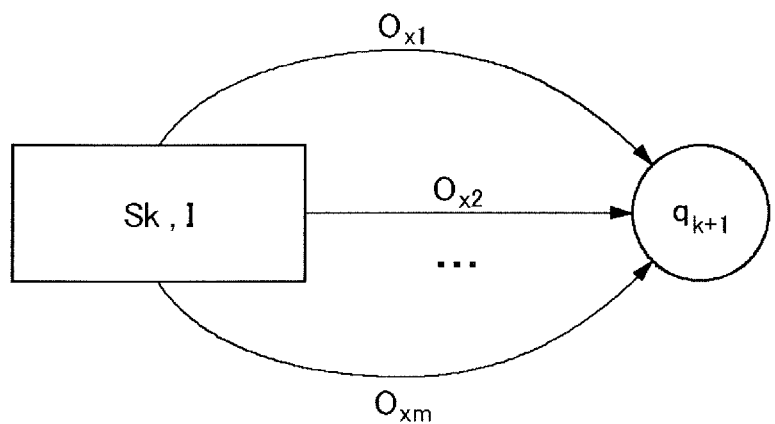

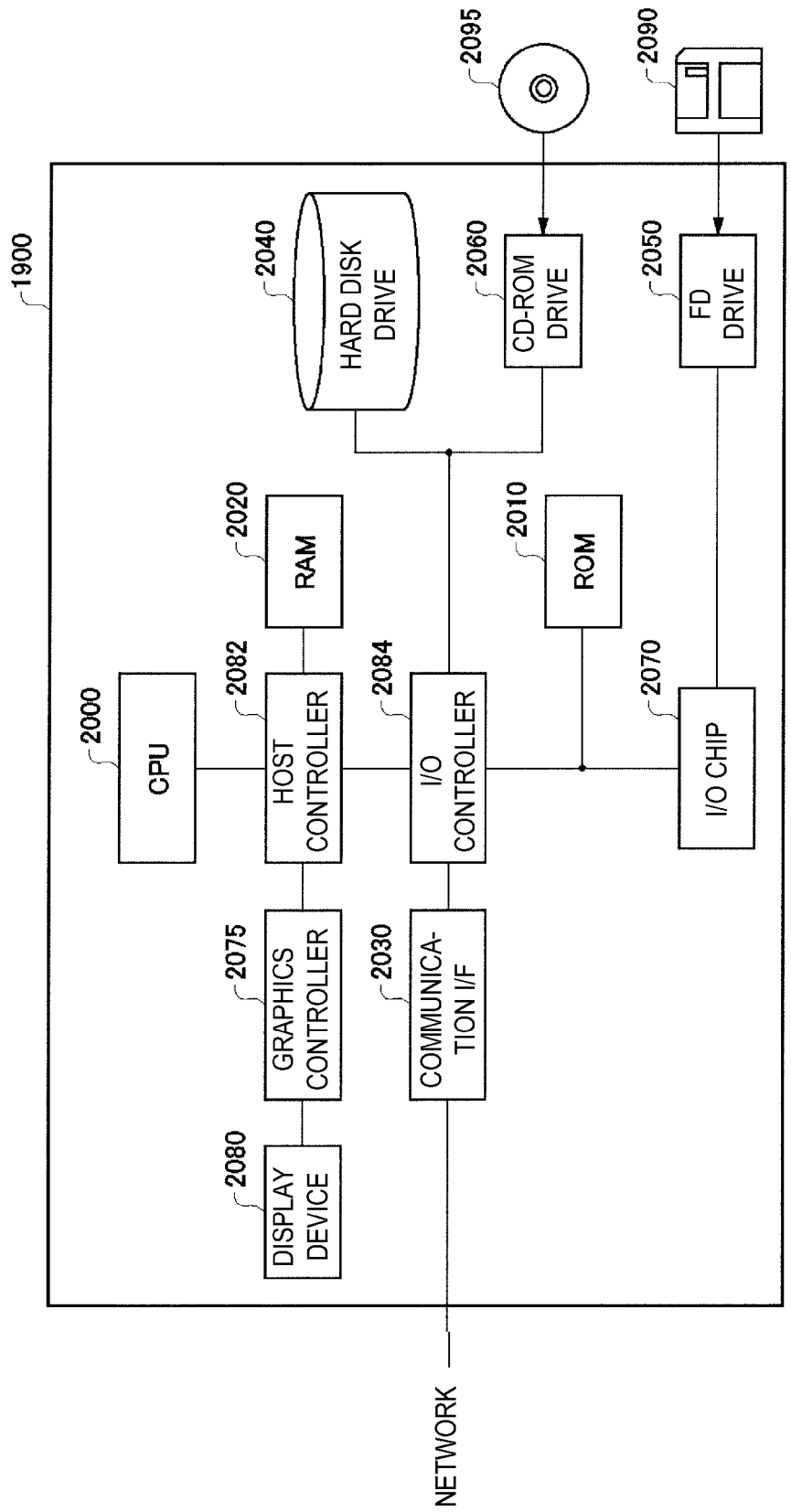
[Figure 19]

GENERATION DEVICE, GENERATION METHOD, AND PROGRAM

BACKGROUND

The present disclosure generally relates to a generation device, and more particularly relates to a generation method, and a program for generating a test sequence.

Up to now, a technique for performing a test that covers a large number of input conditions, using a combinational test has been known (for example, Patent Literature 1 and Non-patent Literatures 1 and 2). Unfortunately, if the combinational test is applied to a system for receiving an ordered sequence, the number of tests could be too large and/or the test could be too long.

In view of the above, a known method for testing a system for receiving an ordered sequence involves checking a test case by describing a state machine, a temporal logic, and the like (for example, Patent Literatures 2 and 3). Unfortunately, in general, according to this method, an input space is complicated, checking of completeness is difficult, and detailed specifications about the operation sequence received by the system as a test target are required. Moreover, Patent Literature 2 has a problem that the test target needs to be reducible to an automaton, and Patent Literature 3 has a problem that a specific algorithm for generating the test case is not disclosed.

CITATION LIST

Patent Literature

[Patent Literature 1] JP2012-185642A
[Patent Literature 2] JP2011-065576A
[Patent Literature 3] JP2010-191899A

Non-Patent Literature

[Non-patent Literature 1] "Software fault interactions and implications for software testing." Software Engineering, IEEE Transactions on 30.6 (2004): 418-421.
[Non-patent Literature 2] "MUSTC-Testing: Multi-Stage-Combinational Test scheduling at the Register-Transfer Level." VLSI Design, 1995, Proceedings of the 8th International Conference on. IEEE, 1995.

BRIEF SUMMARY

In order to solve the problems described above, the present invention provides a technique for ensuring a large coverage of a test case without defining an operation sequence in detail for a system for receiving an ordered sequence.

A first aspect of the present invention provides a device for generating a test sequence to be supplied to a test target, the generation device including: a test vector generation unit for selecting, for each of a plurality of parameters to be included in a test vector, one value from among possible values for the parameter to generate a plurality of test vectors whose combinations of values are different from each other; an extraction unit for extracting, as a plurality of partial sequences each including one or more test vectors, a plurality of portions of a series including the plurality of test vectors output by the test vector generation unit; and a test sequence generation unit for generating a test sequence based on the extracted plurality of partial sequences. The first aspect of the present invention also provides a generation method using the generation device and a program used for the generation device.

Note that all necessary features of the present invention are not listed above in the summary of the invention. Moreover, sub-combinations of these feature groups can also be included in the present invention.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which:

FIG. 1 illustrates an outline of processing of the present embodiment;

FIG. 2 illustrates a configuration of a generation device 10 of the present embodiment;

FIG. 3 illustrates a processing flow by the generation device 10 of the present embodiment;

FIG. 4 illustrates example parameters of test vectors according to the present embodiment;

FIG. 5 illustrates an example series of the test vectors according to the present embodiment;

FIG. 6 illustrates example processing in S130 by an extraction unit 150 of the present embodiment;

FIG. 7 illustrates example partial sequences according to the present embodiment;

FIG. 8 illustrates example processing by the extraction unit 150 according to the present embodiment;

FIG. 9 illustrates example processing by the extraction unit 150 according to the present embodiment;

FIG. 10 illustrates example processing by the extraction unit 150 according to the present embodiment;

FIG. 11 illustrates example processing by a test sequence generation unit 160 according to the present embodiment;

FIG. 12 illustrates an example test sequence according to the present embodiment;

FIG. 13 illustrates an example test sequence according to the present embodiment;

FIG. 14 illustrates an example test sequence according to the present embodiment;

FIG. 15 illustrates an example test sequence according to the present embodiment;

FIG. 16 illustrates an example test sequence according to the present embodiment;

FIG. 17 illustrates an example test sequence according to the present embodiment;

FIG. 18 illustrates a proof of completeness of a state transition of a test target by the generation device 10; and FIG. 19 illustrates an example hardware configuration of a computer 1900.

DETAILED DESCRIPTION

Hereinafter, the present invention is described by way of an embodiment of the invention, and the following embodiment is not intended to limit the invention according to Scope of Claims. Moreover, all combinations of features described in the embodiment are not necessarily essential to solving means of the invention.

FIG. 1 illustrates an outline of processing of the present embodiment.

In the present embodiment, a generation device 10 receives, from a user, a setting file in which specifications of an operation of a test target (SUT) and the length of a test sequence are set, and defines an operation in accordance with the setting file, to thereby generate test vectors according to a pairwise method or the like. The generation device 10 generates a test sequence including a set of operations based on the test vectors.

After that, a test driver causes the test target to execute the operations based on the test sequence, and acquires the execution result, to thereby obtain a test result corresponding to the test sequence. The generation device 10 according to the present embodiment can ensure completeness of operations and states on the basis of the setting file, and can generate the test sequence whose length is suppressed within a realistically executable range.

FIG. 2 illustrates a configuration of the generation device 10 of the present embodiment. The generation device 10 generates a test sequence to be supplied to a system as a test target for receiving an ordered sequence, the test sequence being a consecutive operation sequence. For example, the generation device 10 generates a test sequence obtained by coupling test vectors that are operations to be input to the test target. The generation device 10 includes a first reception unit 100, a test vector generation unit 120, a second reception unit 130, a third reception unit 140, an extraction unit 150, and a test sequence generation unit 160.

The first reception unit 100 receives, from a user terminal 20 or the like, prohibition rule information for defining combinations of values that cannot be used, for parameters as factors included in a test vector. The first reception unit 100 supplies the received prohibition rule information to the test vector generation unit 120.

The test vector generation unit 120 selects a value of each parameter (that is, a level of each factor) of a test vector to generate test vectors whose combinations of values taken by the parameters are different from each other. For example, according to a pairwise method, the test vector generation unit 120 generates the test vectors that cover all possible patterns taken by the combinations of the values of the parameters.

Here, the test vector generation unit 120 may generate the test vectors that take combinations of values whose use is permitted, on the basis of the prohibition rule information. The test vector generation unit 120 outputs a series of the generated test vectors to the extraction unit 150.

The second reception unit 130 receives, from the user terminal 20 or the like, commutativity information indicating a condition of values of the parameters under which the order of two or more test vectors is changeable. The second reception unit 130 supplies the commutativity information to the extraction unit 150.

The third reception unit 140 receives, from the user terminal 20 or the like, error condition information indicating a condition of a series including one or more test vectors under which causes an error and makes it impossible to continue a test of the test target. The third reception unit 140 supplies the error condition information to the extraction unit 150.

The extraction unit 150 extracts, as partial sequences each including one or more test vectors, portions of the series including the test vectors output by the test vector generation unit 120. For example, the extraction unit 150 extracts the mutually commutative partial sequences from the series including the test vectors, on the basis of the commutativity information.

Further, the extraction unit 150 may exclude a portion that causes the error from the extracted partial sequences, on the basis of the error condition information, and may further extract partial sequences that do not cause the error. Here, the extraction unit 150 may further generate an error sequence used for a test in which the error is caused, on the basis of the portion that is excluded from the series including the test vectors and causes the error. The extraction unit 150 supplies the partial sequences that do not cause the error and the error sequence to the test sequence generation unit 160.

The test sequence generation unit 160 generates a test sequence on the basis of the extracted partial sequences that do not cause the error. For example, the test sequence generation unit 160 generates a test sequence including a cyclic group of the partial sequences, on the basis of the extracted partial sequences that do not cause the error. The test sequence generation unit 160 may add the error sequence to the test sequence.

As described above, in the generation device 10, the test vector generation unit 120 generates a series of test vectors in which pairwise completeness is ensured, the extraction unit 150 extracts the mutually commutative partial sequences from the series of the test vectors, and the test sequence generation unit 160 generates a test sequence including a cyclic group of the partial sequences. With this configuration, the generation device 10 can cover inputs based on an operation sequence using a realistic test sequence length, without defining a state machine of the test target.

FIG. 3 illustrates a processing flow by the generation device 10 of the present embodiment. In the present embodiment, the generation device 10 executes processing in S110 to S160, to thereby generate the test sequence for the test target.

First, in S110, the first reception unit 100 receives, from the user terminal 20 or the like, prohibition rule information for defining combinations of values that cannot be used for the parameters included in a test vector.

For example, as illustrated in FIG. 4, assume operations on a database, where there are four parameters: ID (an identification number of a record); OP (an operation content); Serial (a personal identification number such as an employee number); and Name (a name) are designated as the test vector for the test target. ID is one of the numbers 1-3. OP is one of INSERT, UPDATE and DELETE. Serial is one of 100, 101, 102 and Null. Name is one of John, Mike, Alice and Null.

For example, the first reception unit 100 receives prohibition rule information that "if OP is Delete (deletion of a record), fields other than ID should be Null". That is, the first reception unit 100 receives "(OP=Delete) and {(Serial=Null) or (Name=Null)}" as the prohibition rule information. The first reception unit 100 supplies the received prohibition rule information to the test vector generation unit 120.

Subsequently, in S120, the test vector generation unit 120 selects, for each of the parameters to be included in the test vector, one value from among possible values taken by each parameter to generate test vectors whose combinations of values taken by the parameters are different from each other. For example, according to a pairwise method, an orthogonal table, a naive method in which all patterns of combinations of parameter values are covered, or the like, the test vector generation unit 120 generates a list including the test vectors that cover all possible patterns taken by the combinations of the values of the parameters.

Note that the test vector generation unit 120 may select possible values taken by all the parameters included in the test vector. Alternatively, the test vector generation unit 120 may select possible values taken by only a predetermined number of parameters of all the parameters, and may set a predetermined value to each of the other parameters.

Moreover, the test vector generation unit 120 generates the test vectors that take combinations of values whose use is permitted, on the basis of the prohibition rule information acquired from the first reception unit 100. For example, the test vector generation unit 120 may set negative to a condition of a parameter whose error is indicated by the prohibition rule information, to generate the test vectors according to the pairwise method.

As an example, on the basis of the prohibition rule information that "if OP is Delete (deletion of a record), fields other than ID should be Null", the test vector generation unit 120 generates a test vector in which ID is Delete and Name or Serial is Null, and avoids generating a test vector in which ID is Delete and Name or Serial is other than Null.

Specifically, as illustrated in FIG. 5, the test vector generation unit 120 generates eighteen test vectors according to the pairwise method, on the basis of the values of the parameters illustrated in FIG. 4. The eighteen test vectors illustrated in FIG. 5 include pairs of all values such as "INSERT & 102" and "UPDATE & Mike". The test vector generation unit 120 outputs a series including the generated test vectors to the extraction unit 150.

Subsequently, in S130, the extraction unit 150 extracts partial sequences in which one or more test vectors are ordered and arranged, from the series including the test vectors.

For example, first, the second reception unit 130 receives, from the user terminal 20 or the like, commutativity information indicating a condition of values of the parameters under which the order of two or more test vectors is changeable, and supplies the commutativity information to the extraction unit 150. That is, for two test vectors $a_i$ and $a_j$ included in a series a of n test vectors ($a \in \{a_1, a_2, \ldots, a_n\}$), the second reception unit 130 supplies a condition of parameters of the test vectors $a_i$ and $a_j$ under which the result obtained by executing in order of $a_i \to a_j$ and a result obtained by executing in order of $a_j \to a_i$ are equal to each other, as the commutativity information to the extraction unit 150.

As an example, in the case of the test vectors for records as illustrated in FIG. 5, if the order of two test vectors having the same value in ID (for example, the second test vector [1, UPDATE, 101, Mike] and the tenth test vector [1, UPDATE, NULL, John]) is reversed, the obtained result is changed by UPDATE (an update process) that is last executed. Because two test vectors having different values in ID (for example, the first test vector [2, INSERT, 102, Mike] and the second test vector [1, UPDATE, 101, Mike]) are processes on different records, even if the two test vectors are executed in the reverse order, the obtained result is not changed. In such a case, the second reception unit 130 receives, from the outside, commutativity information to the effect that "operations having different values in ID are commutative", and supplies the commutativity information to the extraction unit 150. The commutativity information may be created in advance so as to suit specifications of the test target.

Subsequently, the extraction unit 150 extracts the mutually commutative partial sequences each including one or more test vectors from the series including the test vectors that are arranged in the listed order, on the basis of the commutativity information. For example, the extraction unit 150 extracts three partial sequences (G1, G2, and G3) illustrated in FIG. 7 from the series of the test vectors illustrated in FIG. 5. Here, the test vectors included in one partial sequence (for example, G1) and the test vectors included in another partial sequence (for example, G2) are different in ID from each other, and thus are mutually commutative.

Subsequently, in S133, the extraction unit 150 determines whether or not the partial sequence Gi that is the $i^{th}$ partial sequence is an empty set. If the partial sequence Gi is empty, the extraction unit 150 executes the processing in S136. If the partial sequence Gi is not empty, the extraction unit 150 executes the processing in S134.

In S134, on the basis of the commutativity information, the extraction unit 150 determines whether or not at least one test vector included in the partial sequence Gi and the test vector $a_m$ are mutually commutative. If the extraction unit 150 determines that the vectors are mutually commutative, the extraction unit 150 proceeds the processing to S135. If no, the extraction unit 150 proceeds the processing to S136.

In S135, the extraction unit 150 executes a process of adding 1 to i. After that, the extraction unit 150 returns the processing to S133.

In S136, the extraction unit 150 executes a process of adding $a_m$ to the partial sequence Gi. After that, the extraction unit 150 returns the processing to S131.

In this way, the extraction unit 150 allocates each partial sequence $a_m$ to any of the partial sequences Gi. Note that, in the case where a state machine of the test target is defined, the extraction unit 150 may make the upper limit of the number of partial sequences added in S135 equivalent to the number of states of the test target, and may proceed the processing to S136 without executing S135 if the value of i exceeds the number of states.

Subsequently to S130, in S140, the extraction unit 150 excludes a portion that causes an error from the partial sequences, and extracts partial sequences that do not cause the error.

For example, first, the third reception unit 140 receives, from the user terminal 20 or the like, error condition information indicating a condition of a series including one or more test vectors under which an error that makes it impossible to continue a test of the test target is caused, and supplies the error condition information to the extraction unit 150. As an example, the third reception unit 140 supplies, to the extraction unit 150, a condition of parameters of a test vector (that is, a test vector a that satisfies Gx·a=0, in relation to a given partial sequence Gx) corresponding to an incorrect operation on a database, such as: insertion or update of a record having an overlapping primary key; or insertion or update of an incorrect record containing a NULL value. If the incorrect operation is supplied to the test target, the obtained result becomes an error, and the output is not changed even by the subsequent operation.

The extraction unit 150 excludes a test vector that causes the error from each of the partial sequences, on the basis of the error condition information, and generates partial sequences (herein, also referred to as non-error sequences) that do not cause the error and each include one or more test vectors.

Subsequently, in S150, the extraction unit 150 further generates an error sequence used for a test in which the error is caused, on the basis of the portion that is excluded from the series including the test vectors and causes the error. For example, the extraction unit 150 extracts, for each test vector that causes the error in each partial sequence, one or more test vectors that do not cause the error from the first test vector up to the test vector that causes the error, and adds the test vector that causes the error to the one or more test vectors that do not cause the error, and thereby generate an error sequence. The extraction unit 150 may generate error sequences for each test vector that causes the error.

FIG. 8 illustrates a non-error sequence G1-N, an error sequence G1-1, an error sequence G1-2, and an error sequence G1-3 that are generated by the extraction unit 150 from the partial sequence G1. The partial sequence G1 includes six test vectors (1) to (6). The test vectors (2) to (4) of the six test vectors (1) to (6) correspond to an INSERT or UPDATE operation containing Null in Serial or Name, and thus are test vectors that cause the error.

The extraction unit 150 excludes the test vectors (2) to (4) that cause the error from the test vectors (1) to (6) included in the partial sequence G1, to thereby generate the non-error sequence G1-N including the test vector (1), the test vector (5), and the test vector (6).

Moreover, the extraction unit 150 couples: one or more test vectors that do not cause the error in a range of from the first test vector (1) to the test vector (2) that causes the error, that is, the test vector (1); to each of the test vectors (2) to (4) that cause the error. As a result, the extraction unit 150 generates: the error sequence G1-1 including the test vectors (1) and (2); the error sequence G1-2 including the test vectors (1) and (3); and the error sequence G1-3 including the test vectors (1) and (4).

FIG. 9 illustrates a non-error sequence G2-N, an error sequence G2-1, and an error sequence G2-2 that are generated by the extraction unit 150 from the partial sequence G2.

Similarly to the processing in FIG. 8, the extraction unit 150 excludes test vectors (3) to (4) that cause the error from test vectors (1) to (5) included in the partial sequence G2, to thereby generate the non-error sequence G2-N including the test vector (1), the test vector (2), and the test vector (5). The extraction unit 150 further generates: the error sequence G2-1 including the test vectors (1) to (3); and the error sequence G2-2 including the test vectors (1), (2), and (4).

FIG. 10 illustrates a non-error sequence G3-N, an error sequence G3-1, and an error sequence G3-2 that are generated by the extraction unit 150 from the partial sequence G3.

Similarly to the processing in FIG. 8, the extraction unit 150 excludes test vectors (2) and (6) that cause the error from test vectors (1) to (7) included in the partial sequence G3, and thereby generates the non-error sequence G3-N including the test vector (1), the test vectors (3) to (5), and the test vector (7). The extraction unit 150 further generates: the error sequence G3-1 including the test vectors (1) and (2); and the error sequence G3-2 including the test vectors (1) and (3) to (6).

The extraction unit 150 supplies the extracted non-error sequences and the extracted error sequences to the test sequence generation unit 160.

Subsequently, in S160, the test sequence generation unit 160 generates a test sequence having a length equal to or larger than a designated sequence length designated in advance, on the basis of the extracted non-error sequences. The test sequence generation unit 160 further generates a test sequence on the basis of the error sequences.

For example, the test sequence generation unit 160 generates, as the test sequences, (1) repetitions of each of the non-error sequences, (2) a sequence obtained by coupling (1) the repetitions of each of the non-error sequences, (3) cyclic groups of the non-error sequences, and/or (4) a sequence obtained by coupling the cyclic groups of the non-error sequences.

FIG. 11 illustrates an example processing in S160 by the test sequence generation unit 160. Here, the operations resulting from concatenating the test vectors in the non-error sequences G1-N, G2-N, and G3-N in order that are generated in S140 by the extraction unit 150 are respectively defined as O1, O2, and O3, and "." in FIG. 11 is defined as an operator for coupling operations before and after ".".

The test sequence generation unit 160 generates, as the test sequences, (1) an operation in which O1 is repeated a predetermined number of times, an operation in which O2 is repeated a predetermined number of times, and an operation in which O3 is repeated a predetermined number of times, (2) an operation in which O1 is repeated a predetermined number of times, O2 is then repeated a predetermined number of times, and O3 is then repeated a predetermined number of times, (3) an operation in which O1, O2, and O3 are executed in the stated order, an operation in which O2, O3, and O1 are executed in the stated order, and an operation in which O3, O1, and O2 are executed in the stated order, and (4) an operation in which O1, O2, O3, O2, O3, O1, O3, O1, and O2 are executed in the stated order.

FIGS. 12 to 14 each illustrates an example test sequence generated by the test sequence generation unit 160 according to the present embodiment. For example, the test sequence generation unit 160 generates a test sequence in which each of the operations O1 to O3 respectively corresponding to the partial sequences G1-N to G3-N is repeated, as (1) the operation in which each of O1 to O3 is repeated the predetermined number of times.

For example, as illustrated in FIG. 12, the test sequence generation unit 160 generates a test sequence in which three test vectors of [1, UPDATE, 101, Mike], [1, UPDATE, 11 , John], and [1, DELETE, NULL, NULL] included in O1 are repeated a plurality of number of times.

For example, as illustrated in FIG. 13, the test sequence generation unit 160 generates a test sequence in which three test vectors of [2, INSERT, 102, Mike], [2, UPDATE, 11 , Alice], and [2, DELETE, NULL, NULL] included in O2 are repeated a plurality of number of times.

For example, as illustrated in FIG. 14, the test sequence generation unit 160 generates a test sequence in which five test vectors of [3, INSERT, 101, Alice], [3, UPDATE, 11 , John], [3, UPDATE, 102, Alice], [3, DELETE, NULL, NULL], and [3, INSERT, 100, Mike] included in O3 are repeated a plurality of number of times.

FIGS. 15 to 17 each illustrate another example test sequence generated by the test sequence generation unit 160 according to the present embodiment. For example, the test sequence generation unit 160 generates a test sequence in which O1, O2, and O3 respectively corresponding to the partial sequences G1-N to G3-N are coupled in order, as (3) the operation in which O1 to O3 are executed in cyclic order.

For example, as illustrated in FIG. 15, the test sequence generation unit 160 generates a test sequence O1.O2.O3 in which [1, UPDATE, 101, Mike], [1, UPDATE, 102, John], and [1, DELETE, NULL, NULL] included in O1, [2, INSERT, 102, Mike], [2, UPDATE, 100, Alice], and [2, DELETE, NULL, NULL] included in O2, and [3, INSERT, 101, Alice], [3, UPDATE, 100, John], [3, UPDATE, 102, Alice], [3, DELETE, NULL, NULL], and [3, INSERT, 100, Mike] included in O3 are coupled in the stated order.

Moreover, for example, as illustrated in FIG. 16, the test sequence generation unit 160 generates a test sequence O2.O3.O1 in which [2, INSERT, 102, Mike], [2, UPDATE, 100, Alice], and [2, DELETE, NULL, NULL] included in O2, [3, INSERT, 101, Alice], [3, UPDATE, 100, John], [3, UPDATE, 102, Alice], [3, DELETE, NULL, NULL], and [3, INSERT, 100, Mike] included in O3, and [1, UPDATE, 101, Mike], [1, UPDATE, 102, John], and [1, DELETE, NULL, NULL] included in O1 are coupled in the stated order.

Moreover, for example, as illustrated in FIG. 17, the test sequence generation unit 160 generates a test sequence O3.O1.O2 in which [3, INSERT, 101, Alice], [3, UPDATE, 100, John], [3, UPDATE, 102, Alice], [3, DELETE, NULL, NULL], and [3, INSERT, 100, Mike] included in O3, [1, UPDATE, 101, Mike], [1, UPDATE, 102, John], and [1, DELETE, NULL, NULL] included in O1, and [2, INSERT, 102, Mike], [2, UPDATE, 100, Alice], and [2, DELETE, NULL, NULL] included in O2 are coupled in the stated order.

Here, the test sequence generation unit 160 may add the error sequence received from the extraction unit 150, to the test sequence.

In this way, in consideration of the prohibition rule information, the generation device 10 selects combinations of levels from factors according to the pairwise method or the like to generate a test vector, and treats the test vector as an input to the test target. As a result, the generation device 10 can secure completeness of factors included in a test vector as a unit operation.

Moreover, the generation device 10 applies coupling rules to generated test vectors, to further generate a partial sequence in which the test vectors are ordered based on the commutativity of operations. As a result, through application of a cyclic group, the generation device 10 can apply an output of a combinational test method such as the pairwise method to the test target for receiving an ordered sequence, without defining a state machine.

Moreover, the generation device 10 generates a test sequence based on a partial sequence from which test vectors corresponding to operations that cause the error are removed, and generates another test sequence for the error portion. As a result, the generation device 10 can separately execute a test of an error process while omitting a useless operation from the test sequences.

Further, the generation device 10 applies a cyclic group to a partial sequence from which the error is removed, to generate a test sequence. As a result, the generation device 10 can secure completeness of a state transition of the test target using the test sequence of a realistically testable length. For example, a test sequence generated according to a naive method has a length of $k^k$, and the generation device 10 of the present embodiment can generate a test sequence having a length of approximately $k^2$.

Note that, instead of acquiring the prohibition rule information, the commutativity information, and/or the error condition information from the user terminal or the like, the generation device 10 may store these pieces of information in a storage device in advance, and may read out the stored pieces of information from the storage device as needed.

FIG. 18 illustrates a proof of the completeness of the state transition of the test target by the generation device 10. Here, it is assumed that the test target has k states and that {O1, O2, ..., Ok} covers the possibility cases of operations that provoke the test target into causing an error (failure). On these assumptions, it is proved that test vectors in (4) the sequence (O1.O2.O3.O2.O3.O1.O3.O1.O2) obtained by coupling the cyclic groups of the non-error sequences by the generation device 10 cover the possibility of provocation of every error (failure), that is, it is proved that the generation device 10 secures the completeness of the state transition of the test target.

Note that the assumption that {O1, O2, ..., Ok} covers the possibility cases of operations received by the test target is an empirical hypothesis that is obtained through tests using the pairwise method and the orthogonal table, and its effectiveness is confirmed by many examples.

(1) Definition

The test target as a state machine is defined by $S_{k,l}=\{Q, \Sigma, \Delta\}$. Here, Q is a set of a finite number of states, and $|Q|=k$. $\Sigma$ is a residue class of l types of operations received by the test target, and satisfies $\Sigma \cong \{O_l\}$ (homomorphism). The transition is defined by $\Delta \subseteq Q \times \Sigma \times \Sigma$.

(2) Theorem

In the case of $T_k$ ($k \geq 1$) (a set of test vectors), $T_k$ covers all states of $S_{k,1}$. This is denoted by $T_k \uparrow S_{k,1}$.

(3) Proof

Proof is given according to induction for k.

It is self-evident that $T_1 \uparrow S_{l,1}$ is established.

If $T_k \uparrow S_{k,1}$ is established, it is necessary to prove that $T_{k+1} \uparrow S_{k+1,1}$ is also established.

Here, a state that is newly added at $S_{k+1,1}$ is represented by $q_{k+1}$. Moreover, a path from $S_{k,1}$ to $q_{k+1}$ is represented by $O_{x1}, \ldots, O_{xm}$. With the use of the fact that (4) the sequence obtained by coupling the cyclic groups of the non-error sequences is configured such that $\forall j; T_{k+1} \subseteq T_k O_{kj}$, the entire path from $S_{k,1}$ to $q_{k+1}$ can be covered by $T_{k+1}$ in consideration of $m \leq k$. Accordingly, if $T_k \uparrow S_{k,1}$ is established, $T_{k+1} \uparrow S_{k+1,1}$ is also established, and the completeness of the transition state of the test target is secured.

FIG. 19 illustrates an example hardware configuration of a computer 1900 that functions as the generation device 10. The computer 1900 according to the present embodiment includes: a CPU peripheral unit including a CPU 2000, a RAM 2020, a graphics controller 2075, and a display device 2080 that are connected to one another by a host controller 2082; an input/output unit including a communication interface 2030, a hard disk drive 2040, and a CD-ROM drive 2060 that are connected to the host controller 2082 by an input/output controller 2084; and a legacy input/output unit including a ROM 2010, a flexible disk drive 2050, and an input/output chip 2070 that are connected to the input/output controller 2084.

The host controller 2082 connects the RAM 2020 to the CPU 2000 and the graphics controller 2075 that access the RAM 2020 at high transmission rates. The CPU 2000 operates and controls each unit on the basis of programs stored in the ROM 2010 and the RAM 2020. The graphics controller 2075 acquires image data that is generated by the CPU 2000 and the like on a frame buffer provided in the RAM 2020, and displays the image data on the display device 2080. Alternatively, the graphics controller 2075 may include a frame buffer for storing image data generated by the CPU 2000 and the like.

The input/output controller 2084 connects the host controller 2082 to the communication interface 2030, the hard disk drive 2040, and the CD-ROM drive 2060 that are relatively high-speed input/output devices. The communication interface 2030 makes communications with other devices via a network through wires or radio waves. Moreover, the communication interface functions as hardware for making communications. The hard disk drive 2040 stores therein programs and data used by the CPU 2000 in the computer 1900. The CD-ROM drive 2060 reads a program or data from a CD-ROM 2095, and provides the program or data to the hard disk drive 2040 through the RAM 2020.

Moreover, the ROM 2010 and the flexible disk drive 2050 and the input/output chip 2070 that are relatively low-speed input/output devices are connected to the input/output controller 2084. The ROM 2010 stores therein a boot program executed at the time of activation of the computer 1900 and/or programs depending on hardware of the computer 1900. The flexible disk drive 2050 reads a program or data from a flexible disk 2090, and provides the program or data to the hard disk drive 2040 through the RAM 2020. The input/output chip 2070 connects the flexible disk drive 2050 to the input/output controller 2084, and connects various input/output devices to the input/output controller 2084 through, for example, a parallel port, a serial port, a keyboard port, and a mouse port.

The programs that are provided to the hard disk drive 2040 through the RAM 2020 are provided by a user in the state where the programs are stored in a recording medium such as the flexible disk 2090, the CD-ROM 2095, or an IC card. The programs are read out from the recording medium, are installed onto the hard disk drive 2040 in the computer 1900 through the RAM 2020, and are executed by the CPU 2000.

The programs that are installed onto the computer 1900 to cause the computer 1900 to function as the generation device 10 include a first reception module, a test vector generation module, a second reception module, a third reception module, an extraction module, and a test sequence generation module. These programs or modules may act on the CPU 2000 and the like to cause the computer 1900 to function as the first reception unit 100, the test vector generation unit 120, the second reception unit 130, the third reception unit 140, the extraction unit 150, and the test sequence generation unit 160.

Information processing described in these programs is read onto the computer 1900 to thereby function as the first reception unit 100, the test vector generation unit 120, the second reception unit 130, the third reception unit 140, the extraction unit 150, and the test sequence generation unit 160 that are specific means achieved by cooperation of software and the above-mentioned various hardware resources. Then, computation or processing of information suited to the intended use of the computer 1900 according to the present embodiment is achieved by these specific means, whereby a special generation device 10 suited to its intended use is constructed.

As an example, in the case where the computer 1900 makes communications with an external device or the like, the CPU 2000 executes a communication program loaded onto the RAM 2020, and instructs the communication interface 2030 to perform a communication process, on the basis of a processing content described in the communication program. Upon reception of control by the CPU 2000, the communication interface 2030 reads out transmission data stored in a transmission buffer region or the like provided on a storage device such as the RAM 2020, the hard disk drive 2040, the flexible disk 2090, or the CD-ROM 2095, and transmits the transmission data to the network. Otherwise, the communication interface 2030 writes reception data received from the network into a reception buffer region or the like provided on the storage device. In this way, the communication interface 2030 may transfer the transmission/reception data with respect to the storage device according to a direct memory access (DMA) method. Alternatively, the CPU 2000 may read out data from the transfer-origin storage device or communication interface 2030, and may write the data into the transfer-destination communication interface 2030 or storage device, to thereby transfer the transmission/reception data.

Moreover, the CPU 2000 reads the entire or a necessary portion from files, databases, or the like stored in an external storage device such as the hard disk drive 2040, the CD-ROM drive 2060 (the CD-ROM 2095), or the flexible disk drive 2050 (the flexible disk 2090), onto the RAM 2020 through DMA transfer or the like, and performs various processing on the data on the RAM 2020. Then, the CPU 2000 writes the processed data back into the external storage device through DMA transfer or the like. In such processing, the RAM 2020 can be considered to temporarily hold the contents of the external storage device, and hence, in the present embodiment, the RAM 2020, the external storage device, and the like are generally referred to as a memory, a storage unit, a storage device, and the like.

Various pieces of information such as various programs, pieces of data, tables, and databases in the present embodiment are stored in such a storage device to be subjected to information processing. Note that the CPU 2000 may hold part of the RAM 2020 on a cache memory, and may read and write data on the cache memory. Also in this mode, the cache memory takes on part of the function of the RAM 2020, and hence, in the present embodiment, the cache memory is also included in the RAM 2020, the memory, and/or the storage device unless distinctively described.

Moreover, the CPU 2000 performs, on data read out from the RAM 2020, various processes including various types of computation, information processing, condition determination, and information retrieval/translation that are described in the present embodiment and are designated by a sequence of instructions in a program, and writes the processed data back into the RAM 2020. For example, in the case where the CPU 2000 makes condition determination, the CPU 2000 determines whether or not a condition that various variables described in the present embodiment are larger than, smaller than, equal to or larger than, equal to or smaller than, or equal to another variable or a constant is satisfied. Then, if the condition is satisfied (or is not satisfied), the CPU 2000 moves on to a different sequence of instructions, or invokes a sub-routine.

Moreover, the CPU 2000 can retrieve information stored in a file, a database, or the like in the storage device. For example, in the case where entries in each of which an attribute value having a second attribute is associated with an attribute value having a first attribute are stored in the storage device, the CPU 2000 retrieves an entry in which the attribute value having the first attribute coincides with a designated condition, from among the entries stored in the storage device, and reads out the attribute value having the second attribute stored in the retrieved entry, whereby the CPU 2000 can obtain the attribute value having the second attribute associated with the first attribute that satisfies the designated condition.

The above-mentioned programs or modules may be stored in an external recording medium. Examples of the usable recording medium include an optical recording medium such as a DVD or a CD, a magneto-optical recording medium such as a MO, a tape medium, and a semiconductor memory such as an IC card, in addition to the flexible disk 2090 and the CD-ROM 2095. Moreover, a storage device such as a hard disk or a RAM provided to a server system connected to a private communication network or the Internet may be used as the recording medium, and the programs may be provided to the computer 1900 via the network.

Hereinabove, the present invention has been described by way of the embodiment, and the technical range of the present invention is not limited to the range described above in the embodiment. It is obvious for those skilled in the art that the embodiment can be variously changed or improved. It is obvious from the description in Scope of Claims that such changed or improved modes can also be included in the technical range of the present invention.

It should be noted that processes in operations, procedures, steps, stages, and the like in the devices, the systems, the programs, and the methods described in Scope of Claims, Description, and the drawings can be executed in arbitrary order, unless "before", "prior to", and the like are particularly specified or unless an output of the previous process is used in the subsequent process. Even if operation flows in Scope of Claims, Description, and the drawings are described using "first", "subsequently", and the like for convenience sake, execution in the order indicated by these terms is not intended to be essential.

REFERENCE SIGNS LIST 10 generation device, 20 user terminal, 100 first reception unit, 120 test vector generation unit, 130 second reception unit, 140 third reception unit, 150 extraction unit, 160 test sequence generation unit, 1900 computer, 2000 CPU, 2010 ROM, 2020 RAM, 2030 communication interface, 2040 hard disk drive, 2050 flexible disk drive, 2060 CD-ROM drive, 2070 input/output chip, 2075 graphics controller, 2080 display device, 2082 host controller, 2084 input/output controller, 2090 flexible disk, 2095 CD-ROM

What is claimed is:

1. A generation device for generating a test sequence to be supplied to a test target without defining an operation sequence in detail, the generation device comprising:
   a first reception unit receiving, from a user terminal, prohibition rule information for defining combinations of values that cannot be used, for parameters as factors included in a test vector;
   a test vector generation unit selecting, for each of a plurality of parameters to be included in the test vector, one value from among possible values for the parameter to generate a plurality of test vectors whose combinations of values are different from each other and whose use is permitted, on the basis of the prohibition rule information,
      wherein the test vector generation unit generates the plurality of test vectors that cover all possible patterns taken by combinations of values, according to an orthogonal table, for a predetermined number of parameters of the plurality of parameters;
   a second reception unit receiving commutativity information indicating a condition of values of the plurality of parameters under which order of two or more test vectors is changeable;
   an extraction unit extracting, as a plurality of partial sequences each including one or more test vectors, a plurality of portions of a series comprising an output of the plurality of test vectors by the test vector generation unit, wherein the extraction unit extracts the plurality of partial sequences from the series including the plurality of test vectors, based on the commutativity information; and
   a test sequence generation unit generating a test sequence based on the extracted plurality of partial sequences, wherein the test sequence generation unit generates the test sequence having a length suppressed within a realistically executable range.

2. The generation device according to claim 1, wherein the test vector generation unit outputs a list including the plurality of test vectors, and
   the extraction unit extracts the plurality of partial sequences from the series comprising the plurality of test vectors that are arranged in a listed order.

3. The generation device according to claim 1, further comprising:
   a first reception unit receiving prohibition rule information for defining combinations of values that cannot be used, for the plurality of parameters, wherein
   the test vector generation unit generates the plurality of test vectors that take combinations of values that can be used, based on the prohibition rule information.

4. The generation device according to claim 1, further comprising:
   a third reception unit receiving error condition information indicating a condition of a series including one or more test vectors that causes an error and makes it impossible to continue a test of the test target, wherein
   the extraction unit extracts a plurality of partial sequences that do not cause the error from the plurality of partial sequences, based on the error condition information, and
   the test sequence generation unit generates the test sequence based on the plurality of partial sequences that do not cause the error.

5. The generation device according to claim 4, wherein
   the extraction unit excludes a portion that causes the error from the plurality of partial sequences, based on the error condition information, and extracts the plurality of partial sequences that do not cause the error, and
   the extraction unit further generates an error sequence used for a test in which the error is caused, based on the portion that is excluded from the series including the plurality of test vectors and causes the error.

6. The generation device according to claim 1, wherein the test sequence generation unit generates the test sequence including a cyclic group of the extracted plurality of partial sequences.

7. The generation device according to claim 1, wherein the test sequence generation unit generates the test sequence having the length equal to or larger than a sequence length designated in advance, based on the extracted plurality of partial sequences.

8. A generation method of generating, by a computer, a test sequence to be supplied to a test target without defining an operation sequence in detail, the generation method comprising:
   receiving, from a user terminal, prohibition rule information for defining combinations of values that cannot be used, for parameters as factors included in a test vector;
   selecting, for each of a plurality of parameters to be included in the test vector, one value from among possible values for the parameter to generate a plurality of test vectors whose combinations of values are different from each other and whose use is permitted, on the basis of the prohibition rule information,
      wherein the plurality of test vectors cover all possible patterns taken by combinations of values and are generated according to an orthogonal table for a predetermined number of parameters of the plurality of parameters;
   receiving commutativity information indicating a condition of values of the plurality of parameters under which order of two or more test vectors is changeable;
   extracting, as a plurality of partial sequences each including one or more test vectors, a plurality of portions of a series comprising an output of the plurality of test vectors, wherein the extracting comprises extracting the plurality of partial sequences from the series including the plurality of test vectors, based on the commutativity information; and generating a test sequence based on the extracted plurality of partial sequences, wherein the generating comprises generating the test sequence having a length suppressed within a realistically executable range.

* * * * *